US006835534B2

(12) United States Patent
Weiss et al.

(10) Patent No.: US 6,835,534 B2
(45) Date of Patent: Dec. 28, 2004

(54) CHEMICAL FUNCTIONALIZATION NANOLITHOGRAPHY

(75) Inventors: Paul S. Weiss, State College, PA (US); Ray L. Funk, Port Matilda, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 10/032,649

(22) Filed: Oct. 26, 2001

(65) Prior Publication Data
US 2002/0127491 A1 Sep. 12, 2002

Related U.S. Application Data

(60) Provisional application No. 60/243,774, filed on Oct. 27, 2000.

(51) Int. Cl.⁷ .................................................. G03F 7/00
(52) U.S. Cl. ....................... 430/311; 430/296; 430/322; 430/394; 427/402
(58) Field of Search ........................... 430/5, 296, 322, 430/324, 225, 942; 435/6

(56) References Cited

U.S. PATENT DOCUMENTS

| | | | | | |
|---|---|---|---|---|---|
| 4,945,028 | A | * | 7/1990 | Ogawa | 430/296 |
| 5,079,600 | A | * | 1/1992 | Schnur et al. | 257/750 |
| 5,510,216 | A | * | 4/1996 | Calabrese et al. | 430/16 |
| 5,514,501 | A | * | 5/1996 | Tarlov | 430/5 |
| 5,648,201 | A | | 7/1997 | Dulcey et al. | |

FOREIGN PATENT DOCUMENTS

| EP | 0506 993 A1 | 10/1992 |
|---|---|---|
| WO | WO 97/38802 | 10/1997 |
| WO | WO 97/39151 | 10/1997 |
| WO | WO 98/58293 | 12/1998 |
| WO | WO 03/023517 A1 | 3/2003 |

OTHER PUBLICATIONS

M.J.Lercel et al.; " Electron beam lithography with monolayers of alkylthiols and alkylsiloxanes"; J.Vac.Sci.& Tech. B, 12 (1994), pp 3663–3667.*
R.Moaz et al. " Nanoelectrochmical patterning of Monolayer Surfaces: Towards spatially defined self–assembled nanostructures"; Adv.Mater. v11, (1999), pp 55–61.*
Calvert, "Lithographic patterning of self–assembled films", J. Vc. Sci. Technol. B. 11(6):2155–2163 (1993).
Goelzhaeser et al., "Chemical Nanolithography with Electron Beams", Advanced Materials, VCH Verlagsgesellschaft, Weinheim, DE, 13(11) 806–809 (2001).
Müller et al., "A Strategy of the Chemical Synthesis of Nanostructures", Science, vol. 268, pp. 272–273 (1995).
Sakaki et al., "A Novel Synthesis of β–Ketothioesters", Chem. Parm. Bull, 38(8) 2262–2264 (1990).
Van et al., "Patterning a Preformed, Reactive SAM Using Microcontact Printing", J. Am. Chem. Soc. 120:6179–6180 (1998).

(List continued on next page.)

*Primary Examiner*—Mark F. Huff
*Assistant Examiner*—Kripa Sagar
(74) *Attorney, Agent, or Firm*—McKee, Voorhees & Sease, P.L.C.

(57) ABSTRACT

The present invention discloses devices and methods relating to patterning substrates using chemical functionalization. The methods include covering the surface of a substrate with a first plurality of molecules, selecting at least one internal bond from the plurality of molecules, and reacting the at least one internal bond to form at least one second functional group. Either or both of the functional groups can then be further reacted.

63 Claims, 1 Drawing Sheet

OTHER PUBLICATIONS

"Nanoscale Patterning and Oxidation of H–Passivated Si(100)–2×1 surfaces with an ultrahigh vacuum scanning tunneling microscope", Applied Physics Letters, vol. 64, No. 15, Apr. 11, 1994.

"Interaction of Ga Adsorbates with Dangling Bonds on the Hydrogen Terminated Si(100) Surface", Jpn. J. Appl. Phys. vol. 35 (1996) pp. L1085–L1088, Part 2, No. 8B, Aug. 15, 1996.

"Manipulation of Matter at the Atomic and Molecular Levels" Accounts of chemical Research, vol. 28. No. 3, pp. 95–102 1995.

"Scanning Tunneling Spectroscopy of Dangling–Bond Wires Fabricated on the Si(100)–2×1–H Surface", Jpn. J. Appl. Phys. vol. 36 (1997) pp. L361–L364, Part 2, No. 3B, Mar. 15, 1997.

"Self–Assembly of Mesoscale Objects into Ordered Two–Dimensional Arrays", Science Magazine, vol. 276, Apr. 11, 1997.

"Self–Assembly of an Operating Electrical Circuit Based on Shape Complementarity and the Hydrophobic Effect" Advanced Materials Communications, by Andreas Terfort and George M. Whitesides, 1997.

"Micropatterned Surfaces for Control of Cell Shape, Position, and Function", 1998 American Chemical Society and American Institute of Chemical Engineers.

"Three–Dimensional Mesoscale Self–Assembly", J. Am. Chem. Soc. 1998, 120, 8267–8268.

"Patterning a Preformed, Reactive SAM using Microcontact Printing", J. Am. Chem. Soc. 1998, 120, 6179–6180.

"Using Mixed Self–Assembled Monolayers Presenting RGD and $(EG)_3OH$ Groups To Characterize Long–Term Attachment of bovine Capillary Endothelial Cells to Surface", J. Am. Chem. Soc. 1998, 120, 6548–6555.

"Design and Self–Assembly of Open, Regular, 3D Mesostructures", Science Magazine, vol. 284, May 7, 1999.

"Patterning Ligands on Reactive SAMs by Microcontact Printing", 1999 American Chemical Society, *Langmuir* 1999, 15, 2055–2060.

"Patterning proteins and cells using soft lithography", Biomaterials 20 (1999) 2363–2376.

"Biological surface engineering: a simple system for cell pattern formation", Biomaterials 20 (1999) 1213–1220.

"Mesoscale Self–Assembly of Hexagonal Plates Using Lateral Capillary Forces: Synthesis Using the "Capillary bond"", J. Am. Chem. Soc. 1999, 121, 5373–5391.

"Molecular Rules for Scaling Down Nanostructures", Science Magazine, vol. 291, Feb. 9, 2001.

"Self–assembled monolayer electron beam resist on GaAs", Appl. Phys. Lett. 62(5), Feb., 1, 1993, 1990 American Institute of Physics.

* cited by examiner

SURFACE  COVERED SURFACE  PATTERNED SURFACE

CHEMICAL FUNCTIONALIZATION NANOLITHOGRAPHY

PRIORITY CLAIM

This application claims priority to Provisional Application Ser. No. 60/243,774, filed Oct. 27, 2000, herein incorporated by reference in its entirety.

FIELD OF INVENTION

This invention relates generally to the field of nanofabrication. More specifically, the invention relates to methods of fabricating and modifying nanostructures by patterning the chemical functionality of molecules that overlay a substrate. The invention provides for chemical and spatial complexity and precision such that even nanostructures are scaled down using molecular science. The invention is suited for use in fabricating devices such as sensors, in directional growth or placement of cells, and in self assembly of components into devices.

BACKGROUND OF THE INVENTION

The ability to construct increasingly small and complex structures is of great importance in the fabrication of advanced electronic, optical, photonic, and sensing devices, as well as in other applications. There continues to be increased interest in creating smaller and more precise patterns. Of particular interest is creating patterns on the mesoscale or even the nanoscale. Some of the methods and attempts relating to creating smaller patterns relate to molecular science.

Conventionally, electron, photon, or ion exposure has been used to induce massive changes and bond breakages in polymer resists located on surfaces. Either the exposed or unexposed portions of polymer resists are then removed to leave a pattern. These and other lithographic approaches have been used to pattern surfaces. Lithography techniques involve printing on a surface in either an additive or subtractive process. In an additive process, the pattern that is printed onto a surface creates a new structure or modification to a structure. In a subtractive process, the pattern serves an intermediary role, protecting a portion of the surface while other portions are removed. Such common methods include electron beam lithography. See P. Rai-Choudhury, Ed. *SPIE handbook of Microlithography, Micromachining and Microfabrication* (SPIE, 1997) vol. 1. Other techniques utilize a scanning probe microscope (SPM). See H. Sugimura, N. Nakagiri, *J. Am. Chem. Soc.* 119, 9226 (1997); M. A. Reed, J. Chen, C. L. Asplund, A. M. Cassell, M. L. Myrick, A. M. Rawlett, J. M. Tour, P. G. Van Patten, *Appl. Phys. Lett.* 75, 624 (1999); S. Hong, J. Zhu, C. A. Mirkin, *Science* 286, 523 (1999).

Despite all these different possible methods of creating nanostructures, significant problems and limitations remain. One problem has been that the chemistry used has been imprecise. Typically, polymer molecules are destroyed by irradiation with electrons, ion, and/or photons. These induced reactions are not well-defined and are imprecise. There have been few exceptions to the general problems of poorly defined resists and poorly defined products of induced reactions. One attempt to address one aspect of these problems has been by using monolayers as resists to replace more typical polymer resists in which molecules are randomly oriented, overlay one another in random orientations, and the thickness of the film varies. See R. C. Tiberio, H. G. Craighead, M. Lercel, T. Lau, C. W. Sheen, D. L. Allara, *Appl. Phys. Lett.* 62, 476–478 (1993). In this case, the reaction products and resulting structures remain ill-defined.

One attempt at patterning surfaces is based on selective attachment of monolayers and multi-layers. See A. Hatzor and P. S. Weiss, *Science* 291, 1019 (2001). This method is useful in creating further patterns.

Non-lithographic methods of patterning have been used to pattern surfaces. These methods have been referred to as soft lithography. See R. S. Kane, S. Takayama, E. Ostuni, D. E. Ingber, G. M. Whitesides, *Biomaterials* 20, 2363 (1999). These techniques include microcontact printing, patterning using microfludic channels, and laminar flow patterning. These patterned surfaces have been further used to pattern proteins and cells.

Microcontact printing relies upon the molecular self assembly of self-assembled monolayers (SAMs) to provide for surface patterning. In microcontact printing, a molecular stamp is inked and then applied to a surface. The molecular stamp is then removed, leaving the ink on the surface. Typically, the surface is then immersed in a solution that promotes formation of the self-assembled monolayers on that portion of the surface that was not inked thereby creating a pattern.

Microcontact printing has been combined with chemical reaction. See L. Yan, C. Marzolin, A. Terfort, G. M. Whitesides, *Langmuir* 13, 6704–6712 (1997); L. Yan, X. M. Zhao, G. M. Whitesides, *J. Am. Chem. Soc.* 120, 6179–6180 (1998). A reactive SAM is placed on a substrate, and this reactive substrate is stamped. The mixed SAM can then be reacted further. One advantage of reactive SAM microcontact printing is that more types of functional groups are available than would be using other chemical methods.

Yet problems remain. The precision available using microcontact printing techniques is limited. Further, a number of steps may be required to create complex patterning.

Another attempt at patterning surfaces involves dip-pen lithography. Dip-pen lithography combines atomic force microscopy (AFM) and SAMs technology to provide for direct writing of a pattern on a surface. SAMs are transferred down the tip of the pen to the substrate. Dip-pen lithography provides a direct method of patterning, but is problematic in at least several respects. For example, the process is a very slow serial process. Although it is possible to use tips in parallel, only limited increases in speed are achievable and the resolution is limited.

Generally, in soft lithography, resolution and accessible patterns, and chemical functionality are all limited. One partial exception has been nanoscale patterning of hydrogen terminated silicon surfaces. See J. W. Lyding, T. C. Shen, J. S. Hubacek, J. R. Tucker, G. C. Abeln, *Appl. Phys. Lett.* 64, 2962 (1994). Patterning occurs when electrons field emitted from the probe of a scanning tunneling microscope locally desorb hydrogen, converting the surface into clean silicon. The limitation of this method is that the hydrogen monolayer may not be chemically modified to tailor surface properties further; silicon can be, but has very limited accessible chemistry.

As can be seen from the foregoing discussion, creating devices with nanoscale structures or chemical patterns remains a considerable problem. Thus, a need exists in the art for a method of creating spatially and chemically precise nanostructures or chemically patterned materials or substrates. Such materials would be useful in electronic component fabrication, sensor construction, component assembly, and other applications.

It is therefore an object of the present invention to provide a method for creating such structures that greatly improves the state of the art.

It is another object of the present invention to provide a method of creating nanoscale structures that results in structures that are chemically precise, spatially precise, and simultaneously both chemically and spatially precise.

It is a further object of the present invention to provide a method for creating nanoscale structures that can be chemically modified.

It is a further object of the present invention to provide a method for creating stable nanostructures that can be chemically modified.

It is a further object of the present invention to provide a method for making nanoscale structures that permits complex patterns to be made.

It is a further object of the present invention to provide a method for making nanoscale structures that permit a variety of structures to be created or modified.

It is a further object of the present invention to provide a method of creating nanostructures that allows a number of different nanostructures to be constructed in a single fabrication process or in a series of simple steps.

Yet another object of the present invention is to provide a method of creating patterns through chemical functionalization.

A further object of the present invention is to provide a method of creating patterns that is chemically flexible.

A still further object of the present invention is to provide a method that can use substrates prepared with lithography, soft lithography, or other techniques.

Another object of the present invention is to provide a method that provides for the creation of devices that can be used as or in the process of creating chemical sensors.

Yet another object of the present invention is to provide a method that provides for the creation of devices that can be used as or in the process of creating biological sensors.

Other objects of the invention will become apparent from the description of the invention and that which follows.

SUMMARY OF THE INVENTION

The invention involves novel methods of patterning a substrate surface. The method provides for covering the surface with a first plurality of molecules. The molecules can be a bound monolayer, a bound film of greater thickness, a partial monolayer, or a film that only partially covers the substrate. This partial coverage may be selected by the specific chemical interaction between the plurality of molecules and the materials that comprise the substrate, and may be induced by selective attachment.

The invention provides for selecting particular internal bonds within the plurality of molecules. Then, the selected internal bonds are broken or reacted to form one or more new functional groups. This reaction can be accomplished using electrons, photons, ions, excited atoms or molecules, heat, friction, mechanical contact, or electrochemistry. These can be patterned by scanning, through the use of masks, mechanical contact, and/or projection. Because the invention provides for forming new functional groups selectively throughout the substrate surface or in designated patterns, these newly created functional groups provide advantages.

In particular, a reactant can be introduced to the surface of the substrate such that a chemical reaction will occur between the reactant and the newly formed terminal functional group, but there will be no reaction with the portion of the substrate surface where new functional groups were not selectively created. Alternatively, reactants can be introduced that react with functional groups originally present on the substrate surface but do not react with the newly created functional groups. Further, reactants can be introduced that react both with the originally present functional groups and the newly created functional groups to produce different products. These nanostructures can be used for the selected deposition of nanostructures or components; for the selective growth, shaping, or attachment of cells; as the base for the creation of a sensor or sensors; or for other purposes related to nanotechnology.

The patterning of the present invention therefore provides significant advantages in creating or modifying nanostructures. Nanostructures can be created or modified at the molecular level. This can result in smaller nanostructures through a chemical process. These nanostructures can have controlled chemical functionality, and thus controlled chemical, physical, and other properties.

DETAILED DESCRIPTION OF THE INVENTION

The present invention includes methods of patterning surfaces using chemical functionalization. Molecules are used to pattern the chemical functionality of a substrate so that the properties of the substrate can be patterned locally. This localized patterning permits the creation of nanostructures of desired geometries.

The present invention provides for overlaying or covering a substrate surface with molecules. The molecules can be a bound monolayer, a bound film of greater thickness, a partial monolayer, or a film that only partially covers the substrate. This partial coverage may be selected by the specific chemical interaction between the plurality of molecules and the materials that comprise the substrate. The molecules or a portion of the molecules of the overlayer can also be bound to the surface of the substrate. These bonds can be induced by selective attachment. See A. Hatzor and P. S. Weiss, *Science* 291, 1019 (2001).

The present invention provides for any number of molecules to be used depending upon the particular chemical functionalizations sought. For example, molecules containing labile groups, molecules possessing terminal p-nitrobenzylsulfide or o-nitrobenzylsulfide functionalities, and any number of other molecules can be used. As can be appreciated, the selection of a particular type of molecule will be apparent based upon the chemical functionality sought such that one having the benefit of the disclosure of the present invention can appropriately select the molecules. The plurality of molecules, overlayer, monolayer, or multilayer can be patterned, it need not be uniform nor complete. In particular, the present invention can be used in conjunction with any of a number of methods used to pattern the molecules.

Figure 1:
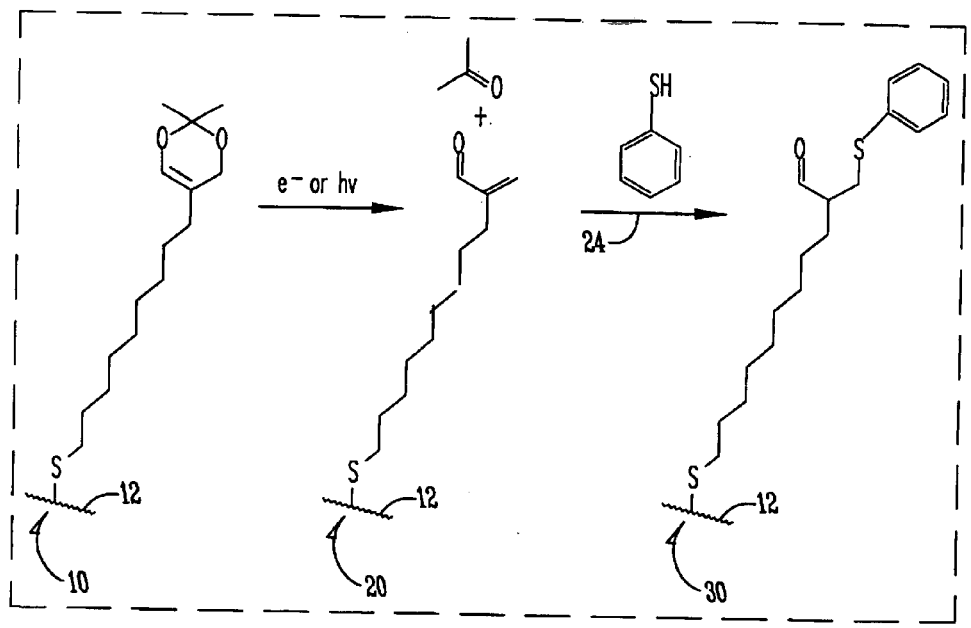
FIG. 1 is a chemical schematic showing a surface with a covalently bound molecule that is first selectively reacted to form a stable intermediary structure and then is further reacted.

FIG. 1 illustrates the steps of one method of the present invention. In step 10, a molecule is shown that is covalently bound to a substrate surface 12. The molecule includes an alkyl chain terminating in a functional group. Energy is then added to break internal bonds of the molecule. The result is shown in step 20. The energy added can be through electron, photon, ion, excited atoms or molecules, voltage, current, or heat sources. Where electrons are used to react internal bonds of the molecule the electrons can be provided with an electron beam or from a scanning probe microscope tip. Where ions are used to react internal bonds of the molecule, the ions can be provided with an ion beam. Where the internal bonds are reacted with heat, the heat source can be the tip of a scanning probe microscope. H. J. Mamin, D. Rugar, *Appl. Phys. Lett.* 61, 1003 (1992). Where photons are used to react internal bonds of the molecule, the photons can be provided or directed by a scanning probe microscope. Novotny L, Bian RX, Xie XS, *Phys. Rev. Lett.* 79, 645 (1997).

Selectively reacting or breaking the bonds results in the molecule or molecules being reacted or dissociated as shown in step 20. After reaction or dissociation, a new terminal functional group is shown. The new terminal functional group shown in step 20 provides new chemical functionality or functionalities for the resulting molecule. Thus, certain reactants can be further reacted with the terminal functional group or groups to form new molecules with different properties. Thus, in this manner, new chemical functionalization is created selectively at the molecular level. By selecting only some of the molecules on a surface to react or break internal bonds, patterns are formed. Further reactions can then take place that involve the newly created functional groups, the original functional groups, or both. This permits even the surfaces of nanoparticles and/or nanostructures created through nanolithography techniques to be patterned.

Included within the scope of this invention are reactions where molecules are dimerized, polymerized, or crosslinked.

Specifically, as shown in FIG. 1, the labile group in molecule 10 is bound to the gold (Au) substrate 12, through a thiolate linkage. In the case shown in figure, molecule 10 forms a monolayer on the surface. The present invention further provides for a multi-layer surface wherein one or more layers contain a molecule to be reacted such as molecule 10. In FIG. 1, a supplied electron induces a retro Diels-Alder reaction involving an electrochemically generated cation intermediate that produces a stable terminal functional group of acrolein. The reaction can be made to take place locally using scanning probe lithography or electron beam irradiation. The present invention permits numerous other methods to be used to initiate the reaction. The reaction can be accomplished using photons, electrons, ions, excited atoms or molecules, heat, friction, mechanical contact, or electrochemistry. These can be patterned by scanning, through the use of masks, mechanical contact, and/or projection.

In another example according to the present invention, a monolayer or multilayer possessing terminal p-nitrobenzylsulfide functionalities is activated and gives rise to terminal thiols via aryl radical anion intermediates that can subsequently be reacted. In yet a further example, a monolayer or multilayer possessing terminal ortho-nitrobenzylsulfide functionalities can be transformed where patterned to the terminal thiols. One skilled in the art having the benefit of this disclosure will appreciate that numerous varieties of terminal groups can be reacted in order to create a diverse variety of exposed surfaces.

Figure 2:
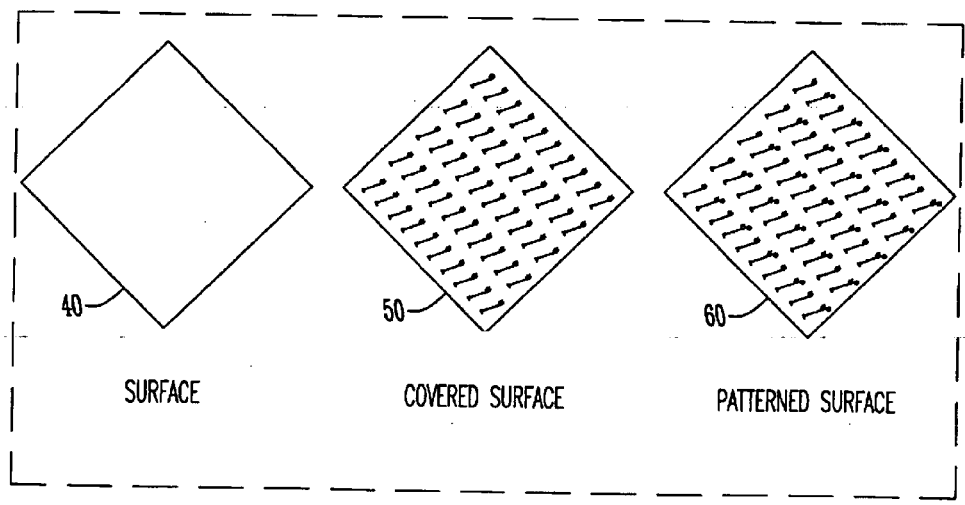
FIG. 2 is a schematic of the surface patterning process.

FIG. 2 is a diagram of the substrate surface. The surface 40 is a substrate surface without an overlayer of bound molecules. The substrate can be any number of substrates including, without limitation, silicon, silicon oxide, gold, silver, copper, gallium arsenide, aluminum oxide, titanium oxide, metals, semiconductors, superconductors, and insulators. The present invention is in no way limited to a particular substrate. The selection of a particular substrate can be made upon the nanostructure or function desired. The surface may be made of more than one material and may be organized in stripes, patterns, and/or other geometries. Further, the molecular film may be placed or patterned in stripes and/or other geometries.

As shown in the surface 50, the molecules are covalently bound to the surface forming stripes. Certain of the molecules are then selected according to the desired structure sought. The specific internal bonds of the selected molecules are reacted. The result is the patterned surface 60 showing that a portion of each of the selected molecules have had their internal bonds reacted to create new functional groups while the unselected molecules have not had their internal bonds reacted, and therefore have no new functional groups.

At this stage, a chemical reactant can be used in one of several different manners. First, a reactant can be used to react with only the functional groups that have not been altered. Alternatively, a reactant can be introduced that will react with only the new functional groups that have been created through the prior reaction of internal bonds. Further, a reactant can be introduced that will react with both the first set of functional groups as well as the new functional groups. In such a reaction, the products of the two different reactions would be different.

Therefore, the present invention provides for the patterned chemical functionalization of a surface. The surface includes a bound film with selected internal bonds. The internal bonds are selectively reacted with electrons, photons, ions, excited atoms or molecules, heat, friction, mechanical contact, or electrochemistry. These exposure-induced reactions enable selective surface functionalization. This patterning or exposure can be accomplished using scanning probe lithography, conventional e-beam lithography, the beam of a scanning electron microscope, photolithography, a beam of scanned ions, and/or mask or projection techniques. Patterning the surface reaction can also be accomplished with locally generated heat using a heated scanning probe microscope tip. Subsequent to patterning, the surface can be processed via chemical exposure, heat, and/or light at selected wavelengths, as well as other known techniques.

A method of patterning that provides chemical functionalization has now been disclosed. One skilled in the art and having benefit of this disclosure will realize that there are many and widespread applications for the invention. In particular, the invention can be used in combination with nanolithography processes and techniques to provide structures that are more precise spatially and chemically. The invention can be used in the fabrication of advanced electronics, optics, photonics, and sensing devices, including both biological and/or chemical sensors. Further, such a device can be used for cell growth or cell placement as have other molecularly scaled devices. The making and use of such devices will be appreciated by those skilled in the art who have the benefit of this disclosure.

The present invention is in no way limited to a particular substrate, a particular molecular film, a particular film thickness, a particular means of reacting internal bonds of molecules of the film, particular reactants, or other variations. The present invention fully contemplates these and other variations, and is to be understood to be construed broadly, limited only by the claims that follow and their equivalents.

What is claimed is:

1. A method of patterning a substrate surface using selective chemistry comprising:
   at least partially covering the surface with a first plurality of molecules at least some of the first plurality of molecules each having internal bonds internal to a ring structure capable of selective reaction upon exposure to electrons, ions, photons, or heat; and
   selectively reacting at least one of the internal bonds to form at least one second functional group.

2. The method of claim 1 further comprising reacting the at least one second functional group with a reactant.

3. The method of claim 1 wherein the first plurality of molecules contain at least one first functional group.

4. The method of claim 3 further comprising reacting the at least one first functional group with a reactant.

5. The method of claim 3 further comprising reacting the at least one second functional group with a reactant.

6. The method of claim 1 wherein the step of reacting in reacting with at least one electron.

7. The method of claim 6 wherein the at least one electron is provided with a scanning probe microscope tip.

8. The method of claim 6 wherein the at least one electron is provided using a mask.

9. The method of claim 6 wherein the at least one electron is provided with an electron beam.

10. The method of claim 9 wherein the electron beam is a scanned electronic beam.

11. The method of claim 6 wherein the at least one electron is patterned using projection.

12. The method of claim 1 wherein the step of reacting is reacting with at least one photon.

13. The method of claim 12 wherein the step of reacting is patterned using a mask.

14. The method of claim 12 wherein the photons are provided using a scanning probe microscope.

15. The method of claim 12 wherein the photons are directed using a scanning probe microscope.

16. The method of claim 1 wherein the step of reacting is reacting with heat.

17. The method of claim 16 wherein the heat is provided with a scanning probe microscope tip.

18. The method of claim 1 wherein the step of reacting is reacting with at least one ion.

19. The method of claim 18 wherein the at least one ion is provided by an ion beam.

20. The method of claim 18 wherein the at least one ion is provided using a mask.

21. The method of claim 18 wherein the at least one ion is patterned using projection.

22. The method of claim 1 wherein the substrate is selected from the set comprising silicon, silicon oxide, gold, silver, copper, gallium arsenide, aluminum oxide, and titanium oxide.

23. The method of claim 1 wherein the substrate is selected from the set comprising metals, semiconductors, insulators, and superconductors.

24. The method of claim 1 wherein the substrate comprises a plurality of materials.

25. The method of claim 24 wherein the plurality of materials is organized in patterns.

26. The method of claim 25 wherein the patterns are stripes.

27. The method of claim 26 wherein the patterns contain one or more geometric shapes.

28. The method of claim 25 wherein the patterns are nanopatterns.

29. The method of claim 1 wherein the substrate is a nanoparticle.

30. The method of claim 1 wherein each of the first plurality of molecules are bound to the surface.

31. The method of claim 28 wherein each of the plurality of molecules are covalently bound to the surface.

32. The method of claim 1 wherein the first plurality of molecules is disposed on a film covering the substrate surface.

33. The method of claim 32 wherein the film includes a monolayer of molecules.

34. The method of claim 33 wherein the monolayer of molecules is placed by selective attachment.

35. The method of claim 33 wherein the monolayer of molecules is placed by selective chemical attachment.

36. The method of claim 32 wherein the film includes a portion of a monolayer of molecules.

37. The method of claim 36 wherein the portion of the monolayer of molecules is placed by selective attachment.

38. The method of claim 36 wherein the portion of the monolayer of molecules is placed by selective chemical attachment.

39. The method of claim 32 wherein the film includes a portion of a multilayer of molecules.

40. The method of claim 39 wherein the portion of a multilayer of molecules is placed by selective attachment.

41. The method of claim 40 wherein the portion of a multilayer of molecules is placed by selective chemical attachment.

42. The method of claim 32 wherein the film includes a multilayer of molecules.

43. The method of claim 42 wherein the multilayer of molecules is placed by selective attachment.

44. The method of claim 43 wherein the multilayer of molecules is placed by selective chemical attachment.

45. The method of claim 1 further comprising processing the patterned surface via chemical exposure.

46. The method of claim 1 further comprising processing the patterned surface via heat.

47. The method of claim 1 further comprising processing the patterned surface via light.

48. The method of claim 1 wherein the at least one internal bond is a labile bond.

49. The method of claim 1 wherein the step of reacting is dissociating.

50. The method of claim 1 wherein the step of reacting is dimerizing.

51. The method of claim 1 wherein the step of reacting is polymerizing.

52. The method of claim 1 wherein the step of reacting is crosslinking.

53. The method of claim 1 wherein the substrate surface is created with nanolithography.

54. A method of patterning a substrate surface comprising:
   overlaying at least one layer of molecules on at least a portion of the substrate surface;
   selecting a plurality of molecules within the at least one layer;
   reacting at least one internal bond of each of the plurality of selected molecules to provide a stable functional terminal group; and
   the internal bond defined as being internal to a ring structure of the molecule.

55. The method of claim 54 further comprising reacting at least a portion of the substrate surface to pattern the substrate surface.

56. The method of claim 55 wherein the at least a portion of the substrate surface includes at least a portion of the selected plurality of molecules.

57. The method of claim 55 wherein the at least a portion of the substrate surface includes the selected plurality of molecules.

58. The method of claim 54 further comprising reacting be terminal function group to pattern the substrate surface.

59. The method of claim 54 wherein the substrate surface is a nanostructure.

60. A method of patterning a substrate surface at a molecular level comprising:
at least partially covering the surface with a first plurality of molecules; and
selectively reacting at least one internal bond internal to a ring structure of one of the plurality of molecules to form at least one second functional group.

61. The method of claim 60 wherein the first plurality of molecules contain at least one first functional group, the first functional group different from the second functional group.

62. A method of patterning a substrate surface using bond selective chemistry comprising:
at least partially covering the surface with a first plurality of molecules having internal bonds internal to a ring structure of each molecule and capable of selective reaction within a first functional group;
selectively reacting the internal bonds of the first functional group to form a stable reactant having a second functional group.

63. The method of claim 62 further comprising reacting the stable reactant.

* * * * *